United States Patent
Lee et al.

(10) Patent No.: US 10,503,439 B2
(45) Date of Patent: *Dec. 10, 2019

(54) MEMORY DEVICE AND OPERATING METHOD INCLUDING A PARTIAL PROGRAM OPERATION AND A PARTIAL ERASE OPERATION THEREOF

(71) Applicant: SK hynix Inc., Icheon-si, Gyeonggi-do (KR)

(72) Inventors: Hee Youl Lee, Icheon-si (KR); Ji Ho Park, Yongin-Si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/159,287

(22) Filed: Oct. 12, 2018

(65) Prior Publication Data

US 2019/0051357 A1 Feb. 14, 2019

Related U.S. Application Data

(63) Continuation of application No. 16/031,147, filed on Jul. 10, 2018, now Pat. No. 10,127,986, which is a (Continued)

(30) Foreign Application Priority Data

Apr. 11, 2016 (KR) .......................... 10-2016-0044281

(51) Int. Cl.
*G11C 16/10* (2006.01)
*G06F 3/06* (2006.01)
(Continued)

(52) U.S. Cl.
CPC .......... *G06F 3/0659* (2013.01); *G06F 3/0614* (2013.01); *G06F 3/0679* (2013.01);
(Continued)

(58) Field of Classification Search
CPC ...... G06F 3/0604; G06F 3/0614; G06F 3/064; G06F 3/0652; G06F 3/0659;
(Continued)

(56) References Cited

U.S. PATENT DOCUMENTS 6,597,609 B2 7/2003 Chevallier
7,804,718 B2 9/2010 Kim
(Continued)

FOREIGN PATENT DOCUMENTS

KR 1020110032795 A 3/2011
KR 1020120079202 A 7/2012

OTHER PUBLICATIONS

"Some—Definition of Some by Merriam-Webster", retrieved Mar. 19, 2016 via the WayBack Machine, <http://web.archive.org/web/20160319122833/https://www.merriam-webster.com/dictionary/some> (Year: 2016).*

*Primary Examiner* — Reginald G Bragdon
*Assistant Examiner* — Aaron D Ho
(74) *Attorney, Agent, or Firm* — William Park & Associates Ltd.

(57) ABSTRACT

There are provided a memory device and an operating method thereof. A memory device may include a memory block, peripheral circuits, and a control logic. The memory block may include a plurality of pages arranged in a vertical direction on a substrate. The peripheral circuits may perform a program operation on a selected page. The control logic may control the peripheral circuits to perform a first partial program operation of sequentially programming some of the pages up to a first page. The control logic may perform a first partial erase operation of erasing the other non-programmed pages. The control logic may perform a second partial program operation of partially programming the pages on which the first partial erase operation has been performed.

7 Claims, 9 Drawing Sheets

Related U.S. Application Data continuation of application No. 15/264,764, filed on Sep. 14, 2016, now Pat. No. 10,049,746.

(51) Int. Cl.
*G11C 16/04* (2006.01)
*G11C 16/16* (2006.01)

(52) U.S. Cl.
CPC .......... *G11C 16/0483* (2013.01); *G11C 16/10* (2013.01); *G11C 16/16* (2013.01)

(58) Field of Classification Search
CPC ..... G06F 3/0665; G06F 3/0673; G11C 16/10; G11C 16/16; G11C 16/0483
USPC ........................................................ 711/154
See application file for complete search history.

(56) References Cited

U.S. PATENT DOCUMENTS

| | | |
|---|---|---|
| 7,965,554 B2 | 6/2011 | Lutze et al. |
| 8,014,209 B2 | 9/2011 | Lutze et al. |
| 8,144,511 B2 | 3/2012 | Dong et al. |
| 2016/0217860 A1 | 7/2016 | Lai et al. |

* cited by examiner

MEMORY DEVICE AND OPERATING METHOD INCLUDING A PARTIAL PROGRAM OPERATION AND A PARTIAL ERASE OPERATION THEREOF

CROSS-REFERENCE TO RELATED APPLICATION

The present application is a continuation application of U.S. application Ser. No. 16/031,147, filed on Jul. 10, 2018, which is a continuation application of U.S. application Ser. No. 15/264,764, filed on Sep. 14, 2016, and claims priority under 35 U.S.C. § 119(a) to Korean patent application number 10-2016-0044281 filed on Apr. 11, 2016 in the Korean Intellectual Property Office, the entire disclosure of which is incorporated herein by reference.

BACKGROUND

1. Technical Field

An aspect of the present disclosure generally relates to a memory device and an operating method thereof, and more particularly to a program method of a three-dimensional memory device.

2. Related Art

A memory device may have memory cells capable of storing data. The memory cells may be grouped into a plurality of memory blocks. The memory device may have peripheral circuits for performing various operations such as a program operation on a selected memory block, and may also have a control logic for controlling the peripheral circuits.

Memory devices may be classified into two categories, two-dimensional and three-dimensional memory devices, depending on how the memory cells included in a memory block are arranged. For example, in a two-dimensional memory device, memory cells may be arranged horizontally with respect to a substrate, and in a three-dimensional memory device, memory cells may be arranged vertically with respect to a substrate.

In the three-dimensional memory device, memory cells may be stacked in the vertical direction on a substrate to improve integration density. A non-volatile memory device may retain its data even in the absence of a power source. Thus, the non-volatile memory device is widely used as a data storage device for portable electronic devices.

SUMMARY

Embodiments provide a memory device and an operating method thereof, which can improve the reliability of a program operation of the memory device.

According to an aspect of the present disclosure, there is provided a memory device including a memory block, peripheral circuits, and a control logic. The memory block may include a plurality of pages arranged in a vertical direction on a substrate. The peripheral circuits may perform a program operation on a selected page among pages. The control logic may control the peripheral circuits to perform a first partial program operation of sequentially programming some of the pages up to a first page. The control logic may perform a first partial erase operation of erasing the other non-programmed pages. The control logic may perform a second partial program operation of partially programming the pages on which the first partial erase operation has been performed.

According to an aspect of the present disclosure, there is provided a method of operating a memory device. The method may include performing an $A^{th}$ partial program operation on selected pages up to a set page. The method may include, if the $A^{th}$ partial program operation is completed up to the set page. The method may include performing a $B^{th}$ partial erase operation on the other non-programmed pages. The method may include performing an $(A+1)^{th}$ partial program operation on the pages on which the $B^{th}$ partial erase operation has been performed.

According to an aspect of the present disclosure, there is provided a method of operating a memory device. The method may include programming memory cells of first and second strings vertically arranged on a substrate. The first and second strings may be coupled to each other through lower portions thereof. The first memory cell located at the uppermost end of the first string may be programmed, and then a second memory cell located at the uppermost end of the second string may be programmed. The method may include programming a third memory cell located at a lower position of the first memory cell and then programming a fourth memory cell located at a lower position of the second memory cell. The method may include programming an $N^{th}$ memory cell of the first string, programming an $(N+1)^{th}$ memory cell of the second string, and then erasing memory cells located at lower ends of the $N^{th}$ and $(N+1)^{th}$ memory cells. The method may include programming the erased memory cells.

According to an aspect of the present disclosure, there is provided a method of operating a memory device. The method may include programming memory cells of first and second strings vertically arranged on a substrate. The first and second strings may be coupled to each other through lower portions thereof. The first partial program operation may be performed in an order from a first memory cell located at the uppermost end of the first string to a memory cell located at a lower position. The method may include, if the first partial program operation is performed up to a set memory cell of the first string, performing a partial erase operation on the other non-programmed memory cells among the memory cells included in the first string. The method may include performing a second partial program operation on the memory cells on which the partial erase operation has been performed; and performing a third partial program operation on the memory cells included in the second string.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

In the following detailed description, only certain exemplary embodiments of the present disclosure have been illustrated and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
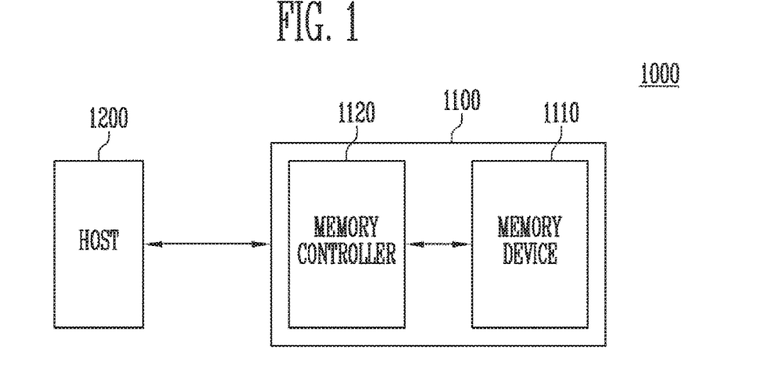
FIG. 1 is a diagram illustrating an example of a memory system according to an embodiment of the present disclosure.

FIG. 1 is a diagram illustrating an example of a memory system according to an embodiment of the present disclosure.

Referring to FIG. 1, the memory system 1000 may include a storage device 1100 and a host 1200 for controlling the storage device 1100. Here, the host 1200 may be a user of the storage device 1100. The storage device 1100 may include a memory device 1110 for storing data therein and a memory controller 1120 for controlling the memory device 1110.

The host 1200 may communicate with the storage device 1100 by using an interface protocol such as peripheral component interconnect-express (PCI-E), advanced technology attachment (ATA), serial ATA (SATA), parallel ATA (PATA), or serial attached SCSI (SAS). In addition, interface protocols between the host 1200 and the storage device 1100 are not limited to the above-described examples, and may be one of other interface protocols such as a universal serial bus (USB), a multi-media card (MMC), an enhanced small disk interface (ESDI), and integrated drive electronics (IDE).

The memory controller 1120 may control operations of the storage device 1100, and may control data exchange between the host 1200 and the memory device 1110. For example, the memory controller 1120 may control the memory device 1110 to perform a program, read, or erase operation in response to a request of the host 1200.

The memory device 1110 may include a double data rate synchronous dynamic random access memory (DDR SDRAM), a low power double data rate 4 (LPDDR4) SDRAM, a graphics double data rate (GDDR) SRAM, a low power DDR (LPDDR), a rambus dynamic random access memory (RDRAM), and a flash memory. In an embodiment, the memory device 1110 including a flash memory will be described as an example.

Figure 2:
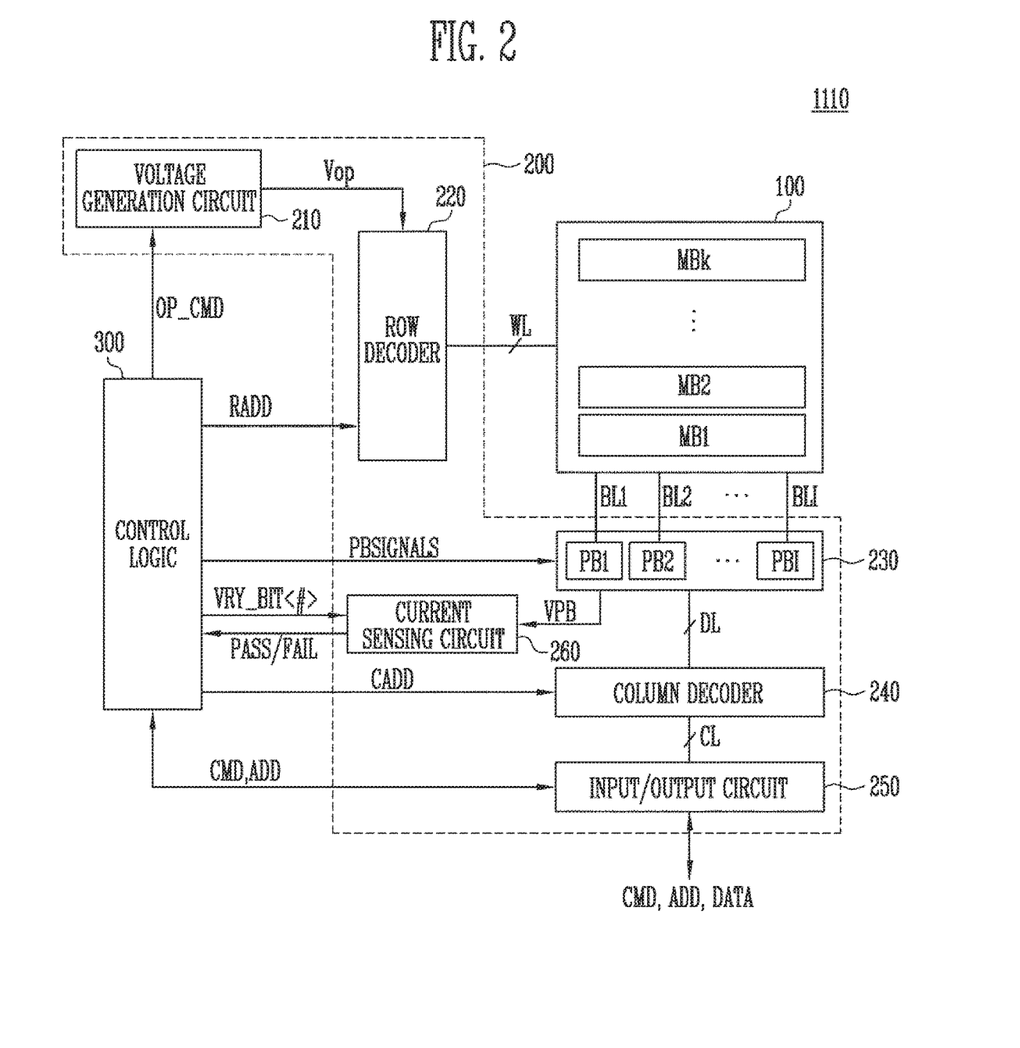
FIG. 2 is a diagram illustrating an example of a memory device of FIG. 1.

FIG. 2 is a diagram illustrating an example of the memory device of FIG. 1.

Referring to FIG. 2, the memory device 1110 may include a memory cell array 100 for storing data. The memory device 1110 may include peripheral circuits 200 that perform a program operation for storing data in the memory cell array 100, a read operation for outputting the stored data, and an erase operation for erasing the stored data. The memory device 1110 may include a control logic 300 for controlling the peripheral circuits 200 under control of the memory controller (1120 of FIG. 1).

The memory cell array 100 may be divided into a plurality of memory blocks MB1 to MBk (k is a positive integer). Word lines WL and bit lines BL1 to BLI (I is a positive integer) may be coupled to the memory blocks MB1 to MBk. The word lines WL may be coupled to the respective memory blocks, and the bit lines BL1 to BLI may be coupled in common to the memory blocks MB1 to MBk. The memory blocks MB1 to MBk may be implemented in a two-dimensional or three-dimensional structure. When the memory blocks MB1 to MBk are implemented in a three-dimensional structure, source select lines, drain select lines, and a source line may be coupled to each of the memory blocks MB1 to MBk, in addition to the word lines WL. Pipe lines may be additionally coupled to each of the memory blocks MB1 to MBk.

The peripheral circuits 200 may program memory cells, and may erase data from memory cells under control of the control logic 300. In a program operation, the peripheral circuits 200 may sequentially program memory cells of selected pages. In an embodiment, if a previously set page is selected, the peripheral circuits 200 may perform a partial erase operation. For example, if the set page is selected, the peripheral circuits 200 may perform a partial erase operation on all or some of non-programmed pages, and then perform the program operation on the pages on which the partial erase operation has been performed. To this end, the peripheral circuits 200 may include a voltage generation circuit 210, a row decoder 220, a page buffer unit 230, a column decoder 240, an input/output circuit 250, and a current sensing circuit 260.

Each circuit may operate as follows.

The voltage generation circuit 210 may generate various operating voltages Vop that will be used in a program, read, or erase operation in response to an operation signal OP_CMD. For example, the voltage generation circuit 210 may generate a program voltage, a read voltage, a pass voltage, a turn-on voltage, and the like.

The row decoder 220 may apply the operating voltages Vop to a word line WL coupled to a selected memory block in response to a row address RADD. Although not illustrated in FIG. 2, the row decoder 220 may apply the operating voltages Vop to source select lines, drain select lines, a source line, or pipe lines in response to the row address RADD.

The page buffer unit 230 may include a plurality of page buffers PB1 to PBI respectively coupled to the bit lines BL1 to BLI. The page buffers PB1 to PBI may operate in response to page buffer control signals PBSIGNALS. For example, the page buffers PB1 to PBI may temporarily store data received through the bit lines BL1 to BLI, or may sense voltages or currents of the bit lines BL1 to BLI in a read or verify operation. The verify operation may include a verify operation performed in the program and erase operations.

The column decoder 240 may transmit data between the input/output circuit 250 and the page buffer unit 230 in response to a column address CADD. For example, the column decoder 240 may transmit/receive data to/from the page buffers PB through data lines DL, or may transmit/receive data to/from the input/output circuit 250 through column lines CL.

The input/output circuit 250 may transmit, to the control logic 300, a command CMD and an address ADD, which are transmitted from the memory controller (1120 of FIG. 1), or may transmit/receive data DATA to/from the column decoder 240.

In a read or verify operation, the current sensing circuit 260 may generate a reference current in response to a permission bit VRY_BIT<#> and compare the reference current with a sensing voltage VPB received from the page buffer unit 230, thereby outputting a "pass" signal PASS or a "fail" signal FAIL.

The control logic 300 may control the peripheral circuits 200 by outputting the operation signal OP_CMD, the row address RADD, the page buffer control signals PBSIGNALS, and the permission bit VRY_BIT<#> in response to the command CMD and the address ADD. Also, in response to the pass or fail signal PASS or FAIL, the control logic 300 may determine whether a certain memory cell has passed or failed a verification process. In a program operation, the control logic 300 may select one or more pages according to the address ADD and control the peripheral circuits 200 to perform the program operation on the selected pages. In an embodiment, a certain page may be set for a partial erase operation. If any one of the previously set pages is selected, a partial erase operation may be performed on all or some of pages in an erase state, and then the program operation may be performed. In this case, the address of the selected page may be compared with the address of the set page to determine whether to perform the partial erase operation before performing the program operation.

Figure 3:
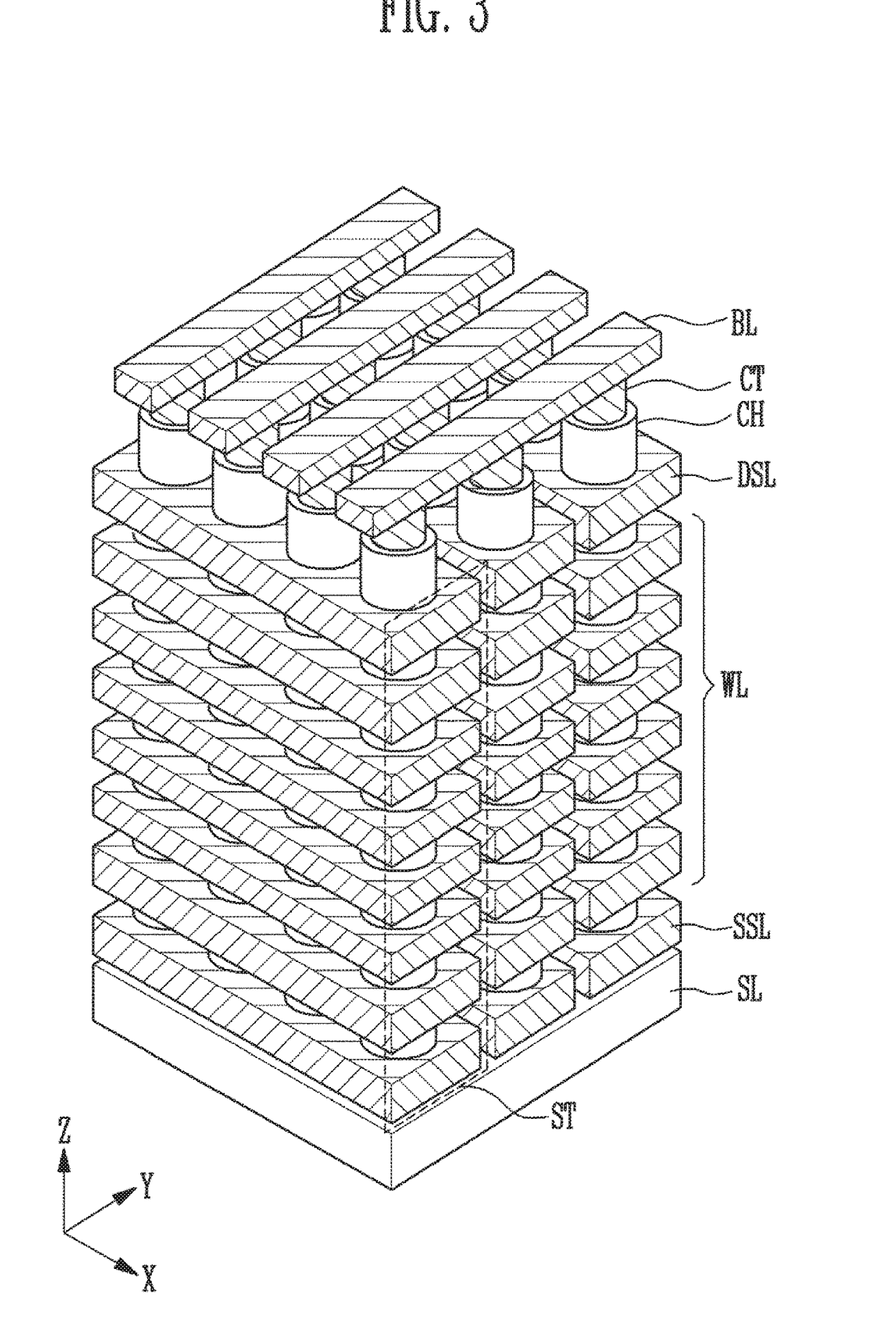
FIG. 3 is a perspective view illustrating an example of a memory block implemented in a three-dimensional structure.

FIG. 3 is a perspective view illustrating an example of a memory block implemented in a three-dimensional structure.

Referring to FIG. 3, the memory block implemented in the three-dimensional structure. For example, a memory block with I-shaped cell strings may be formed in a Z direction over a substrate, and may include cell strings ST arranged between bit lines BL and a source line SL. Example of the I-shaped structure may include "bit cost scalable (BiCS)" structure. For example, if the source line SL is horizontally formed over the substrate, the strings ST (e.g., the strings ST having the BiCS structure) may be formed in the vertical direction (e.g., Z direction) over the source line SL. More specifically, the strings ST may include source select lines SSL, word lines WL, and drain select lines DSL, which are arranged in a first direction (e.g., Y direction) and spaced apart from each other. The number of source select lines SSL, word lines WL, and drain select lines DSL is not limited to the number shown in FIG. 3, and may vary depending on memory devices. The strings ST may include vertical channel layers CH vertically penetrating the source select lines SSL, the word lines WL, and the drain select lines DSL, and the bit lines BL contacting the tops of the vertical channel layers CH protruding upwardly from the drain select lines DSL. The bit lines BL may be arranged in a second direction (e.g., X direction) perpendicular to the first direction (e.g., Y direction). Memory cells may be formed between the word lines WL and the vertical channel layers CH. Contact plugs CT may be further formed between the bit lines BL and the vertical channel layers CH. Memory cells coupled to the same word line may be referred to as a page. A program operation may be performed on a page basis, and a partial erase operation may be performed in one or more pages.

A program operation of the three-dimensional memory device described in FIG. 3 will be described as follows.

Figure 4:
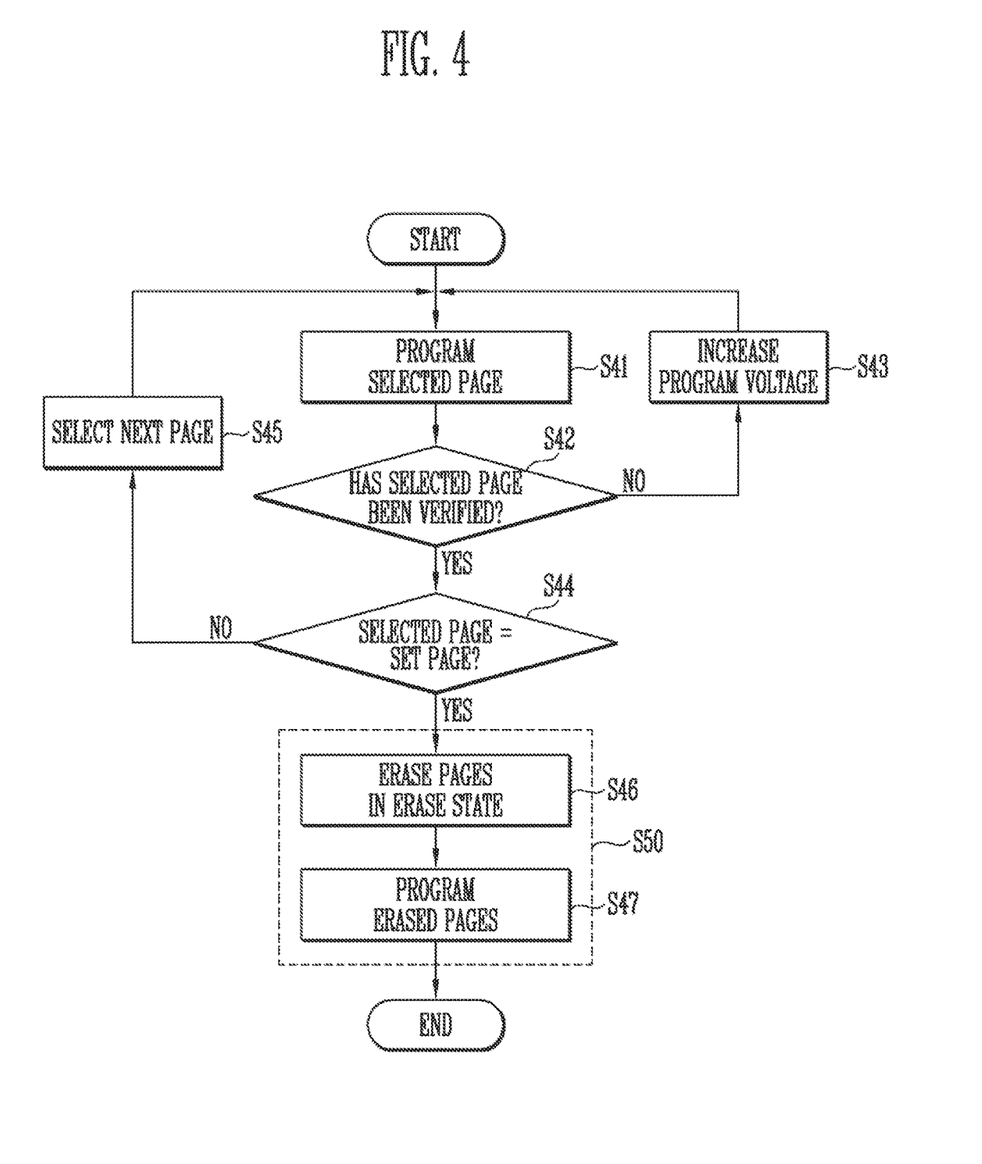
FIG. 4 is a flowchart illustrating an example of a program operation according to an embodiment of the present disclosure.

FIG. 4 is a flowchart illustrating an example of a program operation according to an embodiment of the present disclosure.

Referring to FIG. 4, the program operation may be performed using an incremental step pulse program (ISPP) method in which a program voltage is gradually increased. If the program operation is started, the program operation of a selected page may be performed according to a row address (S41). The program operation of the selected page may be performed by applying a program voltage to a selected word line coupled to the selected page.

After the program voltage is applied to the selected word line for a predetermined time, a verify operation of the selected page is performed (S42). The verify operation of the selected page may be performed by applying a verify voltage to the selected word line. The step S41 of applying the program voltage to the selected word line and the step 42 of applying the verify voltage to the selected word line may constitute a program loop. In the program operation using the ISPP method, as the number of program loops increases, the program voltage is gradually increased. If any memory cell of the selected page has failed the verification process, the program voltage is increased (S43), and the steps 'S41' to 'S43' are repeated.

If the selected page has passed the verification process, it is determined whether the selected page is a set page (S44). The set page may be one of the pages vulnerable to disturbance. For example, the set page may be set to a page in which a program disturbance starts increasing, among pages vulnerable to disturbance. The selected page and the set page may be determined based on their addresses.

The address of the set page may be set during a test program operation of the memory device, and the address of the selected page may be stored in a storage unit of the memory device. For example, in the test program operation, the address of a page in which the program disturbance starts increasing, among a plurality of pages, may be stored as the address of the set page.

If the address of the selected page is not identical to the address of the set page at the step of comparing the address of the selected page with the address of the set page (S44), a next page is selected for the program operation. Accordingly, the next page becomes the selected page, and the program operation may be sequentially performed on the selected page by repeating the steps discussed above S41 to S45.

If the address of the selected page is identical to the address of the set page (S44), a disturbance compensation operation (S50) may be performed.

The disturbance compensation operation (S50) may be performed on non-programmed pages. For example, the disturbance compensation operation S50 may include a partial ease operation (S46) of all or some of pages in an erase state and a program operation (S47) of the partially erased pages.

The partial erase operation (S46) may be selectively performed on the non-programmed pages. By performing an erase operation on the non-programmed pages before performing a program operation, a distribution of threshold voltages of memory cells of non-programmed pages may be initialized. That is, when the program operation is performed, a pass voltage is applied to word lines coupled to unselected memory cells. In this case, if the unselected memory cells are continuously influenced by the pass voltage, threshold voltages of the unselected memory cells may be changed. For example, if a program disturbance occurs, threshold voltages of the non-programmed memory cells (memory cells in the erase state) may be unintentionally increased. In the program operation, when program operations are performed on a plurality of memory cells in a selected page, and when some of the memory cells in the selected page are supposed to stay in the erase state, if such memory cells are influenced by the program disturbance, their threshold voltages may be increased, and therefore, errors may occur in a read operation. Particularly, due to characteristics of the three-dimensional memory device, a channel area becomes narrower as it comes closer to a lower portion of a string. Hence, memory cells located at the lower portion of the string may be further influenced by the program disturbance, as compared with those located at the upper portion of the string.

In an embodiment, the numbers of the word lines WL may begin at the lower portion of the string, and word line numbers may increase toward a top of the page. In addition, the program operations may be performed in a descending order. In this scenario, the lower the number of the word line number, the more the disturbance. In an embodiment, the partial erase operation may be performed on the memory cells coupled to the low-numbered word lines, so that it is possible to prevent errors from occurring at such memory cells vulnerable to disturbance. The partial erase operation may be performed using an incremental step pulse erase (ISPE) method in which an erase voltage is gradually increased, or may be performed using a method in which only an erase voltage is used without performing an erase verify operation.

If the partial erase operation of all or some of the pages in the erase state is completed (S50), the program operation of the partially erased pages is performed (S47).

In an embodiment, if the program operation is completed up to the set page, the partial erase operation may be performed on the other pages. However, a page on which the partial erase operation is to be performed may be set as the set page. In this case, if the program operation is scheduled to be performed on the set page, the partial erase operation may be performed. As described above, the set page may be determined depending on characteristics of memory devices.

Hereinafter, a program method will be described. According to the program method, after the program operation is performed up to the set page, the partial erase operation is performed.

Figure 5:
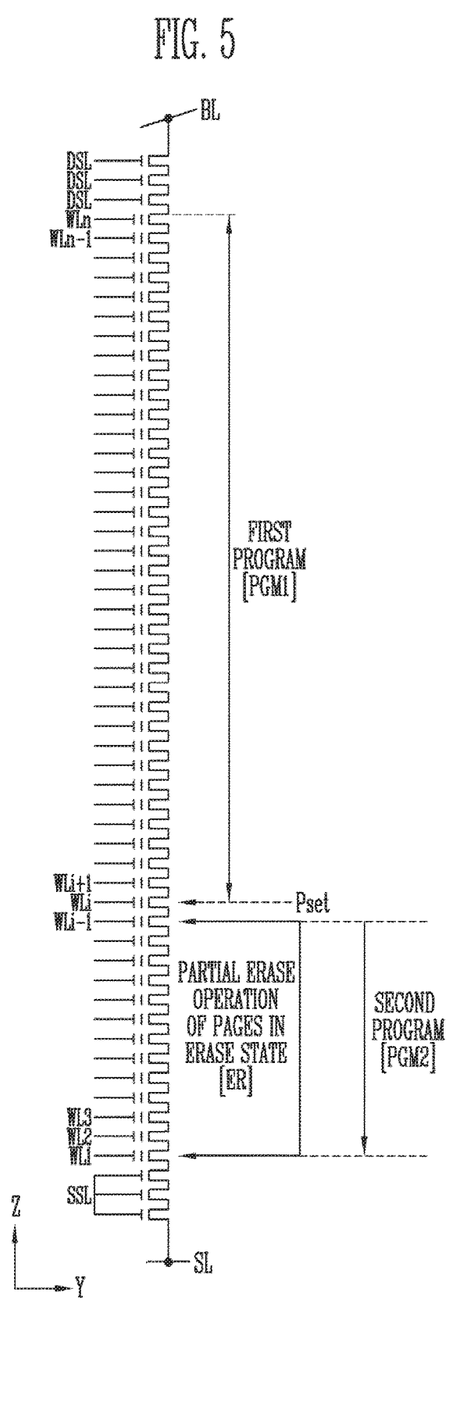
FIG. 5 is a diagram illustrating in detail the program operation according to an embodiment of the present disclosure.

FIG. 5 is a diagram illustrating in detail the program operation according to an embodiment of the present disclosure. Here, the program operation of the I-shaped string illustrated in FIG. 3 will be discussed.

Referring to FIG. 5, it is assumed that a word line adjacent to source select lines SSL is a first word line WL1 and a word line adjacent to drain select lines DSL is an $n^{th}$ word line WLn (n is a positive integer). The program operation may be sequentially performed in an order from an $n^{th}$ page coupled to the $n^{th}$ word line WLn to a first page coupled to the first word line WL1. Here, the $n^{th}$ word line WLn may be a word line located at the uppermost end among the word lines of FIG. 3, and the first word line WL1 may be a word line located at the lowermost end among the word lines of FIG. 3.

In a test program operation of the memory device, when it is determined that a program disturbance frequently occurs in first to $(i-n)^{th}$ pages respectively coupled to first to $(i-1)^{th}$ word lines WL1 to WLi-1 (i is a positive integer, and Rn), an $i^{th}$ page coupled to an $i^{th}$ word line WLi adjacent to an upper portion of the $(i-1)^{th}$ word line WLi-1 may be a set page Pset. Therefore, the program operation may be sequentially performed in an order from the $n^{th}$ page coupled to the $n^{th}$ word line WLn to the $i^{th}$ page coupled to the $i^{th}$ word line WLi. It is assumed that the program operation performed on the $n^{th}$ to $i^{th}$ pages is a first program operation PGM1.

If the first program operation PGM1 is completed, a partial erase operation may be performed on all or some of non-programmed pages (pages in an erase state). For example, a partial erase operation ER may be performed on the $(i-1)^{th}$ to first pages respectively coupled to the $(i-1)^{th}$ to first word lines WLi-1 to WL1. Here, the $(i-1)^{th}$ to first pages may be non-programmed pages.

If the partial erase operation ER of the $(i-1)^{th}$ to first pages is completed, the program operation may be sequentially performed on the partially erased $(i-1)^{th}$ to first pages. It is assumed that the program operation performed on the $(i-1)^{th}$ to first pages is a second program operation PGM2.

That is, if the program operation is started, the first program operation PGM is performed on some pages, and, if the first program operation PGM1 is completed up to the set page Pset, the partial erase operation ER is performed on all or some of the other pages. Subsequently, the second program operation PGM2 is performed on the other pages on which the partial erase operation ER has been performed.

Figure 6:
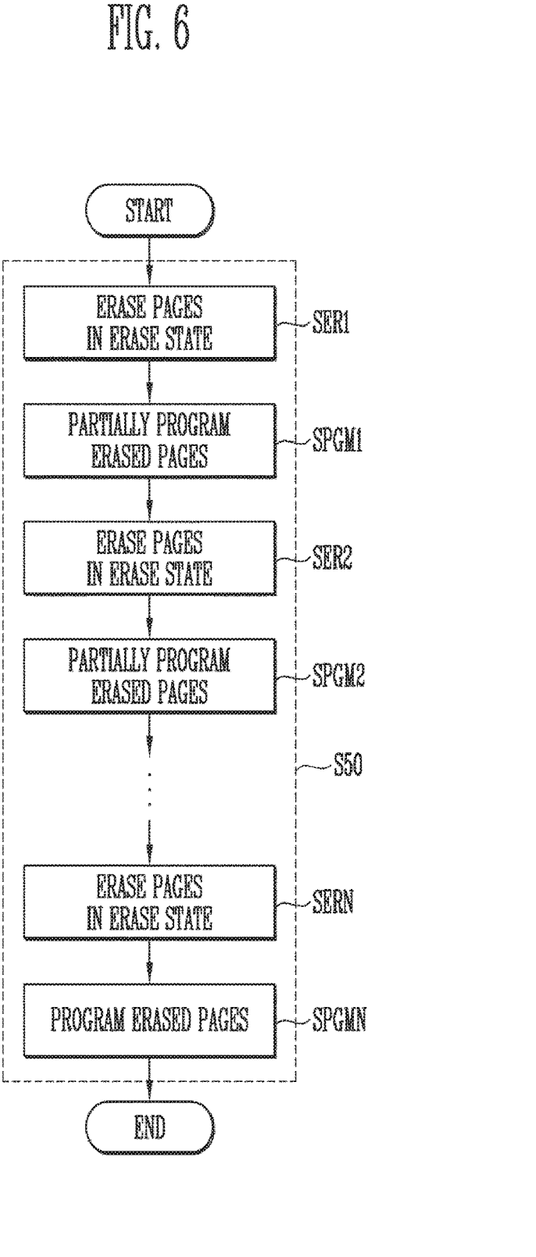
FIG. 6 is a flowchart illustrating a program operation according to an embodiment of the present disclosure.

FIG. 6 is a flowchart illustrating a program operation according to an embodiment of the present disclosure.

In the program operation of FIG. 6, the steps 'S41' to 'S44' discussed above may be performed as well, but a disturbance compensation operation of FIG. 6 may be different from the disturbance compensation operation discussed above (S50).

In the disturbance compensation operation according to an embodiment, a partial erase operation and a partial program operation of erased pages may be performed on a page group basis. For example, if the first program operation (PGM1 of FIG. 5) is performed on pages up to the set page and is completed, a first partial erase operation SER1 may be performed on all or some of the other non-programmed pages (pages in the erase state). The first partial erase operation SER1 may be performed on all of the other pages on which the first program operation PGM1 has not been performed.

If the first partial erase operation SER1 is completed, a first partial program operation SPGM1 may be performed on some pages among the pages on which the first partial erase operation SER1 has been performed. The first partial program operation SPGM1 is not performed on all of the pages on which the first partial erase operation SER1 has been performed. Instead, the first partial program operation SPGM1 may be performed up to another set page.

If the first partial program operation SPGM1 is completed up to the another set page, a second partial erase operation SER2 may be performed on all or some of the other non-programmed pages. The second partial erase operation SER2 may be performed on all of the other pages on which the first partial program operation SPGM1 has not been performed. That is, while the first partial program operation SPGM1 is being performed, a program disturbance may occur in some pages. Therefore, the second partial erase operation SER2 is performed, so that threshold voltages of non-programmed memory cells may be initialized to the erase state.

If the second partial erase operation SER2 is completed, a second partial program operation SPGM2 may be performed on some pages among the pages on which the second partial erase operation SER has been performed. The second partial program operation SPGM2 is not performed on all of the pages on which the second partial erase operation SER2 has been performed. The second partial program operation SPGM2 may be performed up to another set page.

In this manner, an $N^{th}$ partial erase operation SERN and an $N^{th}$ partial program operation SPGMN may be performed on the other pages.

Figure 7:
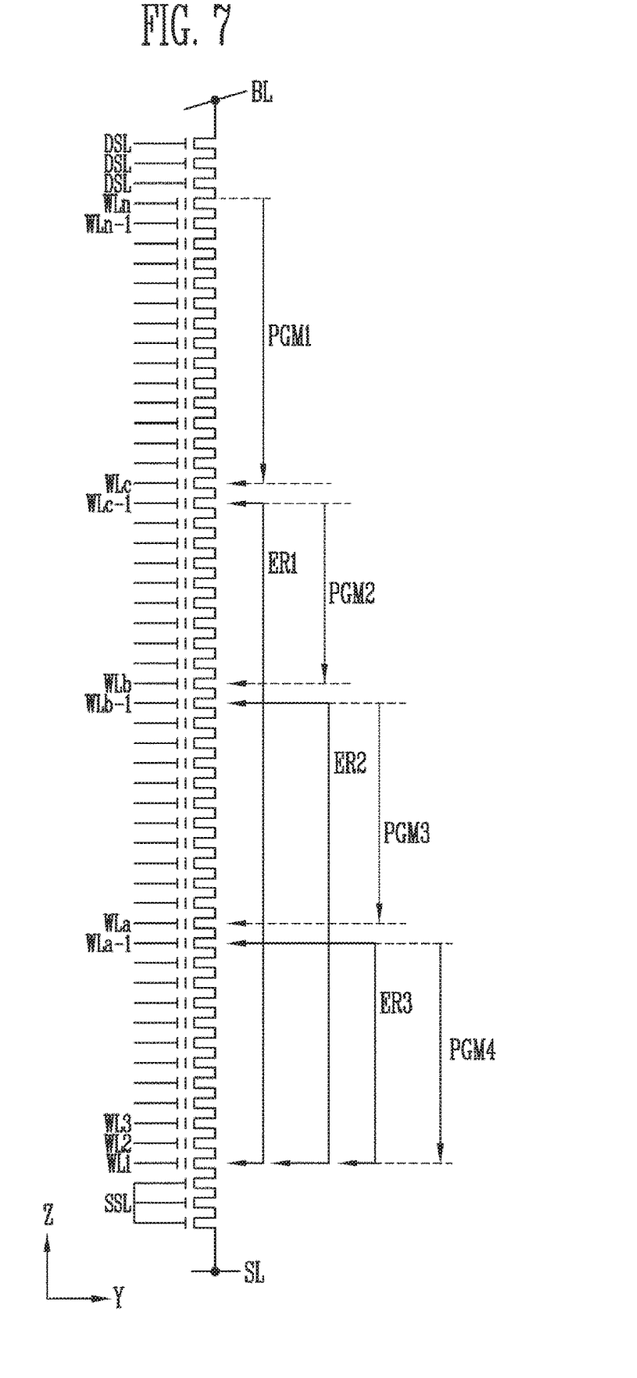
FIG. 7 is a diagram illustrating in detail the program operation according to an embodiment of the present disclosure.

FIG. 7 is a diagram illustrating in detail the program operation according to an embodiment of the present disclosure. Here, it is assumed that the cell strings are I-shaped cell strings illustrated in FIG. 3.

Referring to FIG. 7, the program operation may be sequentially performed in an order from an $n^{th}$ page coupled to an $n^{th}$ word line WLn to a first page coupled to a first word line WL. Here, the $n^{th}$ word line WLn may be a word line located at the uppermost end among the word lines of FIG. 3, and the first word line WL1 may be a word line located at the lowermost end among the word lines of FIG. 3.

In a test program operation of the memory device, although it is determined that a program disturbance frequently occurs in first to $(a-1)^{th}$ pages respectively coupled to first to $(a-1)^{th}$ word lines WL1 to WLa-1 (a is a positive integer, and a<n), the program disturbance may still occur in some of the other pages. Therefore, in an embodiment, the pages may be divided into several groups, and a program operation and a partial erase operation may be performed for each group.

For example, a $c^{th}$ page coupled to a $c^{th}$ word line WLc adjacent to an upper portion of a $(c-1)^{th}$ word line WLc-1 (c is a positive integer, and a<c<n) may be a first set page. The program operation may be sequentially performed in an order from the $n^{th}$ page coupled to the $n^{th}$ word line WLn to the $c^{th}$ page coupled to the $c^{th}$ word line WLc. It is assumed that the program operation performed on the $n^{th}$ to $c^{th}$ pages is a first partial program operation PGM1.

If the first partial program operation PGM1 is completed, a first partial erase operation ER1 is performed on the $(c-1)^{th}$ to first pages respectively coupled to the other $(c-1)^{th}$ to first word lines WLc-1 to WL1 on which the program operation has not been performed. That is, a partial erase operation is performed on non-programmed pages (pages in an erase state).

If the first partial erase operation ER1 of the $(c-1)^{th}$ to first pages is completed, a second partial program operation PGM2 may be sequentially performed on the $(c-1)^{th}$ to b pages respectively coupled to the $(c-1)^{th}$ to b word lines WLc-1 to WLb (b is a positive integer, and a<b<c), among the pages on which the first partial erase operation ER1 has been performed.

If the second partial program operation PGM2 is completed up to the b page, a second partial erase operation ER2 is performed on the $(b-1)^{th}$ to first pages respectively coupled to the $(b-1)^{th}$ to first word lines WLb-1 to WL1 on which the program operation has not been performed.

If the second partial erase operation ER2 of the $(b-1)^{th}$ to first pages is completed, a third partial program operation PGM3 is sequentially performed on the $(b-1)^{th}$ to $a^{th}$ pages respectively coupled to the $(b-1)^{th}$ to $a^{th}$ word lines WLb-1 to WLa, among the pages on which the second partial erase operation ER2 has been performed.

The third partial program operation PGM3 is completed up to the $a^{th}$ page, a third partial erase operation ER3 is performed on the $(a-1)^{th}$ to first pages respectively coupled to the other $(a-1)^{th}$ to first word lines WLa-1 to WL1 on which the program operation has not been performed.

If the third partial erase operation ER3 of the $(a-1)^{th}$ to first pages is completed, a third partial program operation PGM4 is performed on the $(a-1)^{th}$ to the first pages on which the third partial erase operation ER3 has been performed.

Although only four partial program operations PGM1 to PGM4 and three partial erase operations ER1 to ER3 have been illustrated in FIG. 7 for convenience, it should be understood that the present disclosure is not limited thereto. Therefore, partial program operations and partial erase operations may be further performed based on the number of set pages.

Figure 8:
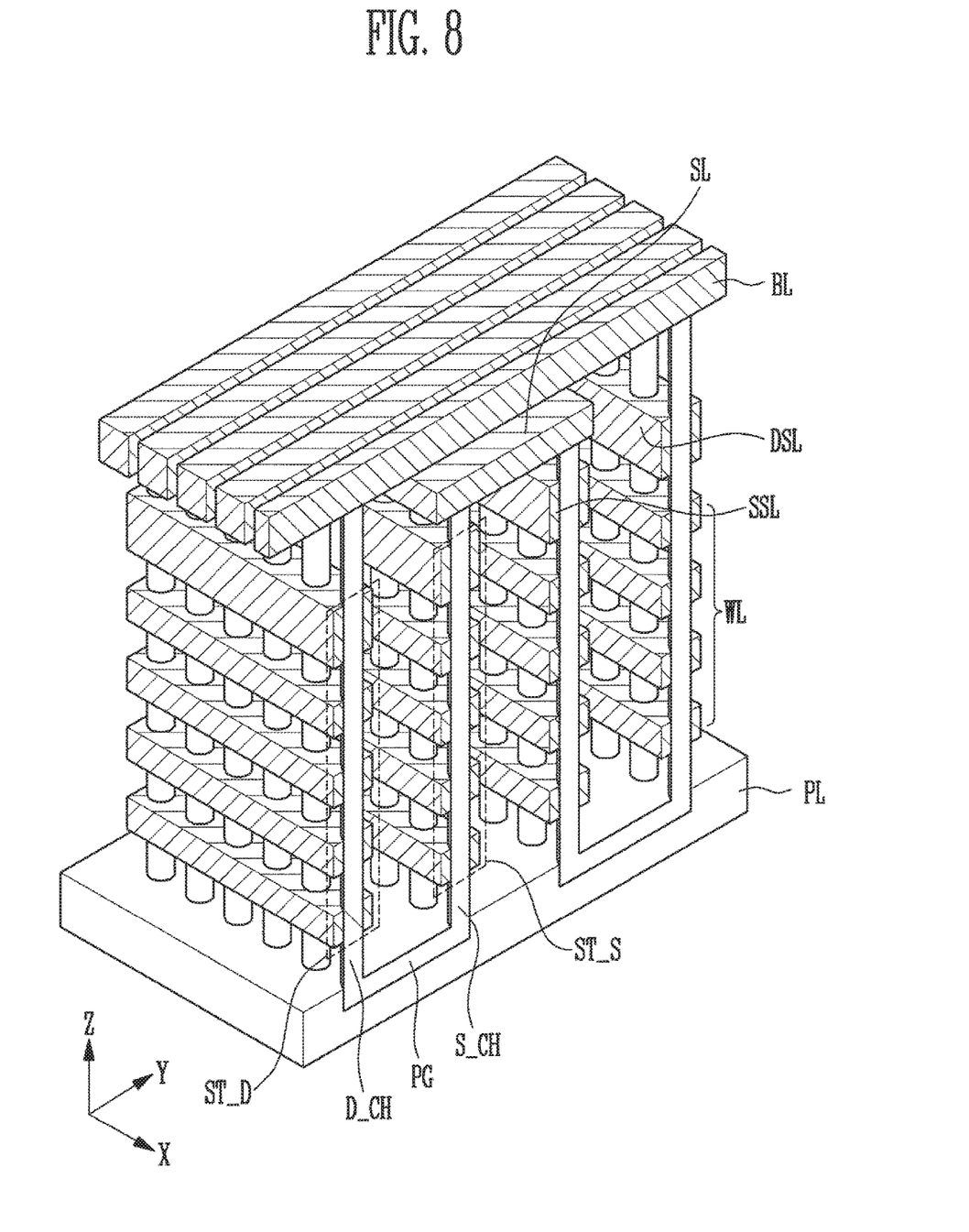
FIG. 8 is a perspective view illustrating an example of the memory block having the three-dimensional structure.

FIG. 8 is a perspective view illustrating an example of the memory block implemented in the three-dimensional structure.

Referring to FIG. 8, the memory block implemented in the three-dimensional structure. For example, a memory block with U-shaped cell strings may be formed in a Z direction over a substrate, and may include source strings ST_S and drain strings ST_D, which are coupled between bit lines BL and a source line SL. The source strings ST_S and the drain strings ST_D may be coupled to each other through pipe channel layers P_CH, to be formed in a U shape. The pipe channel layers P_CH may be formed in a pipe line PL. More specifically, the source strings ST_S may be vertically arranged between the source line SL and the pipe line PL, and the drain strings ST_D may be vertically arranged between the bit lines BL and the pipe line PL. Examples of the U-shaped structure may include a "pipe-shaped bit cost scalable (P-BiCS)" structure.

The drain strings ST_D may include word lines WL and a drain select lines DSL, which are arranged in a first direction (e.g., Y direction) and spaced apart from each other, and drain vertical channel layers D_CH vertically penetrating the word lines WL and the drain select line DSL. The source strings ST_S may include word lines WL and a source select line SSL, which are arranged in the first direction (e.g., Y direction) and spaced apart from each other, and source vertical channel layers S_CH vertically penetrating the word lines WL and the source select line SSL. The drain vertical channel layer D_CH and the source vertical channel layer S_CH may be coupled to each other by the pipe channel layers P_CH in the pipe line PL. The bit lines BL may be arranged in a second direction (e.g., X direction) perpendicular to the first direction (e.g., Y direction) while contacting the tops of the drain vertical channel layers D_CH protruding upwardly from the drain select line DSL.

A program operation of the three-dimensional memory device described in FIG. 8 will be described as follows.

Figure 9:
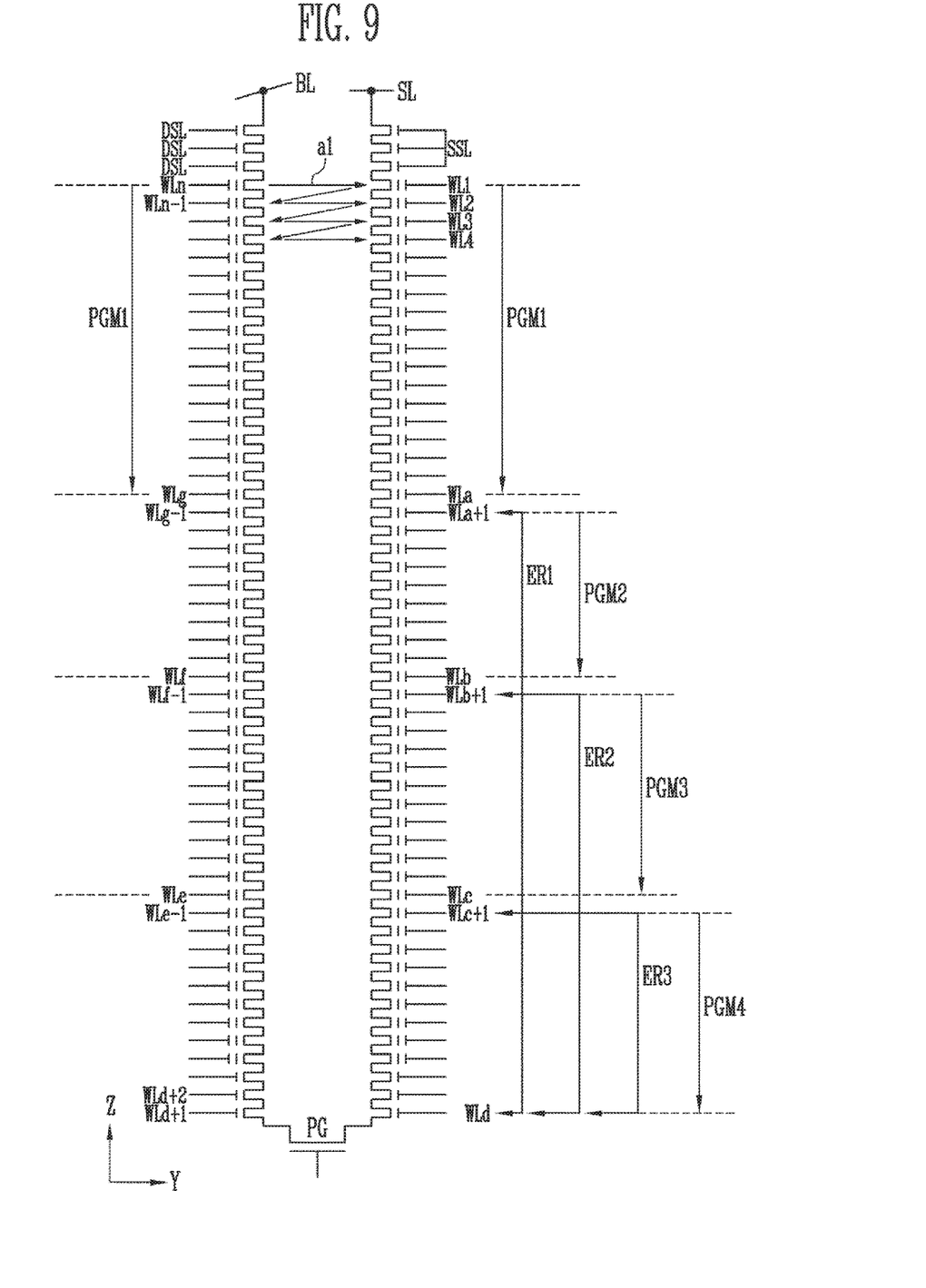
FIG. 9 is a diagram illustrating an example of a program operation according to an embodiment of the present disclosure.

FIG. 9 is a diagram illustrating an example of a program operation according to an embodiment of the present disclosure. Here, the program operation of the U-shaped string illustrated in FIG. 8 will be discussed.

Referring to FIG. 9, the program operation according to an embodiment may be sequentially performed in an order from a page located at the uppermost end to a page located at the lowermost end. For example, in the U-shaped string, it may be assumed that the word line located at the uppermost end among the word lines coupled to the source string (ST_S of FIG. 8) is a first word line WL1, and it may be assumed that the word line located at the lowermost end among the word lines coupled to the source string (ST_S of FIG. 8) is a $d^{th}$ word line WLd. Also, it may be assumed that the word line located at the uppermost end among the word lines coupled to the drain string (ST_D of FIG. 8) is an $n^{th}$ word line WLn, and it may be assumed that the word line located at the lowermost end among the word lines coupled to the drain string (ST_D of FIG. 8) is a $(d+1)^{th}$ word line WLd+1 (d and n are positive integers, and 1<d<n).

When the program operation is performed in an order from pages located at the uppermost end, the program operation may be started from an $n^{th}$ page coupled to the $n^{th}$ word line WLn or a first page coupled to the first word line WL1. When assuming that the program operation is started from the $n^{th}$ page, if the program operation of the $n^{th}$ page is completed, the program operation of the first page located in the same layer as the $n^{th}$ page may be performed. If the program operation of the first page is completed, the program operation of an $(n-1)^{th}$ page coupled to an $(n-1)^{th}$ word line WLn-1 located at a lower end of the $n^{th}$ word line WLn may be performed. If the program operation of the $(n-1)^{th}$ page is completed, the program operation of a second page located in the same layer as the $(n-1)^{th}$ page, the second page being coupled to a second word line WL2 located at a lower end of the first word line WL1, may be performed. In this manner, the program operation may be sequentially performed in an order from pages located at the uppermost ends of the source string ST_S and the drain string ST_D to pages located at a lower position.

If it is assumed that a first program operation performed in an order of the $n^{th}$ page, the first page, the $(n-1)^{th}$ page, and the second page is a first partial program operation PGM1, the first partial program operation PGM1 may be performed up to $g^{th}$ and $a^{th}$ pages respectively coupled to $g^{th}$ and $a^{th}$ word lines WLg and WLa (g and a are positive integers, and a<g) located in the same layer. Here, the $g^{th}$ and $a^{th}$ pages may be set pages.

If the first partial program operation PGM1 is completed, a first partial erase operation ER1 is simultaneously performed on the other $(g-1)^{th}$ to $(d+1)^{th}$ pages respectively coupled to the $(g-1)^{th}$ to $(d+1)^{th}$ word lines WLg-1 to WLd+1, on which the program operation has not been performed, and the other $(a+1)^{th}$ to $d^{th}$ pages respectively coupled to the $(a+1)^{th}$ to $d^{th}$ word lines WLa+1 to WLd, on which the program operation has not been performed.

If the first partial erase operation ER1 is completed, a second partial program operation PGM2 is sequentially performed on $(g-1)^{th}$ to $f^{th}$ pages respectively coupled to $(g-1)^{th}$ to $f^{th}$ word lines WLg-1 to WLf (f is a positive integer, and a<f<g) and $(a+1)^{th}$ to $b^{th}$ pages respectively coupled to $(a+1)^{th}$ to $b^{th}$ word lines WLa+1 to WLb (b is a positive integer, and a<b<g), among the pages on which the first partial erase operation ER1 has been performed. Like the first partial program operation PGM1, the second partial program operation PGM2 may be sequentially performed in an order from pages located at an upper position to pages located at a lower position.

If the second partial program operation PGM2 is completed, a second partial erase operation ER2 is performed on the other $(f-1)^{th}$ to $(d+1)^{th}$ pages respectively coupled to the $(f-1)^{th}$ to $(d+1)^{th}$ word lines WLf-1 to WLd+1, on which the program operation has not been performed, and the other $(b+1)^{th}$ to $d^{th}$ pages respectively coupled to the $(b+1)$ to $d^{th}$ word lines WLb+1 to WLd, on which the program operation has not been performed.

If the second partial erase operation ER2 is completed, a third partial program operation PGM3 is sequentially performed on $(f-1)^{th}$ to $e^{th}$ pages respectively coupled to $(f-1)^{th}$ to $e^{th}$ word lines WLf-1 to WLe (e is a positive integer, and d<e<f) and $(b+1)^{th}$ to $c^{th}$ pages respectively coupled to $(b+1)^{th}$ to $c^{th}$ word lines WLb+1 to WLc (c is a positive integer, and b<c<d), among the pages on which the second partial erase operation ER2 has been performed. Like the first partial program operation PGM1, the third partial program operation PGM3 may be sequentially performed in an order from pages located at an upper position to pages located at a lower position.

If the third partial program operation PGM3 is completed, a third partial erase operation ER3 may be performed on the other $(e-1)^{th}$ to $(d+1)^{th}$ pages respectively coupled to the $(e-1)^{th}$ to $(d+1)^{th}$ word lines WLe-1 to WLd+1, on which the program operation has not been performed, and the $(c+1)^{th}$ to $d^{th}$ pages respectively coupled to the $(C+1)^{th}$ to $d^{th}$ word lines WLc+1 to WLd, on which the program operation has not been performed.

If the third partial erase operation ER3 is completed, a fourth partial program operation PGM4 is sequentially performed on the $(e-1)^{th}$ to $(d+1)^{th}$ pages and the $(c+1)^{th}$ to $d^{th}$ pages, on which the third partial erase operation ER3 has been performed. Like the first partial program operation PGM1, the fourth partial program operation PGM4 may be sequentially performed in an order from pages located at an upper position to pages located at a lower position.

Although only four partial program operations PGM1 to PGM4 and three partial erase operations ER1 to ER3 have been illustrated in FIG. 9 for convenience, it should be understood that the present disclosure is not limited thereto. Therefore, partial program operations and partial erase operations may be further performed based on the number of set pages.

Figure 10:
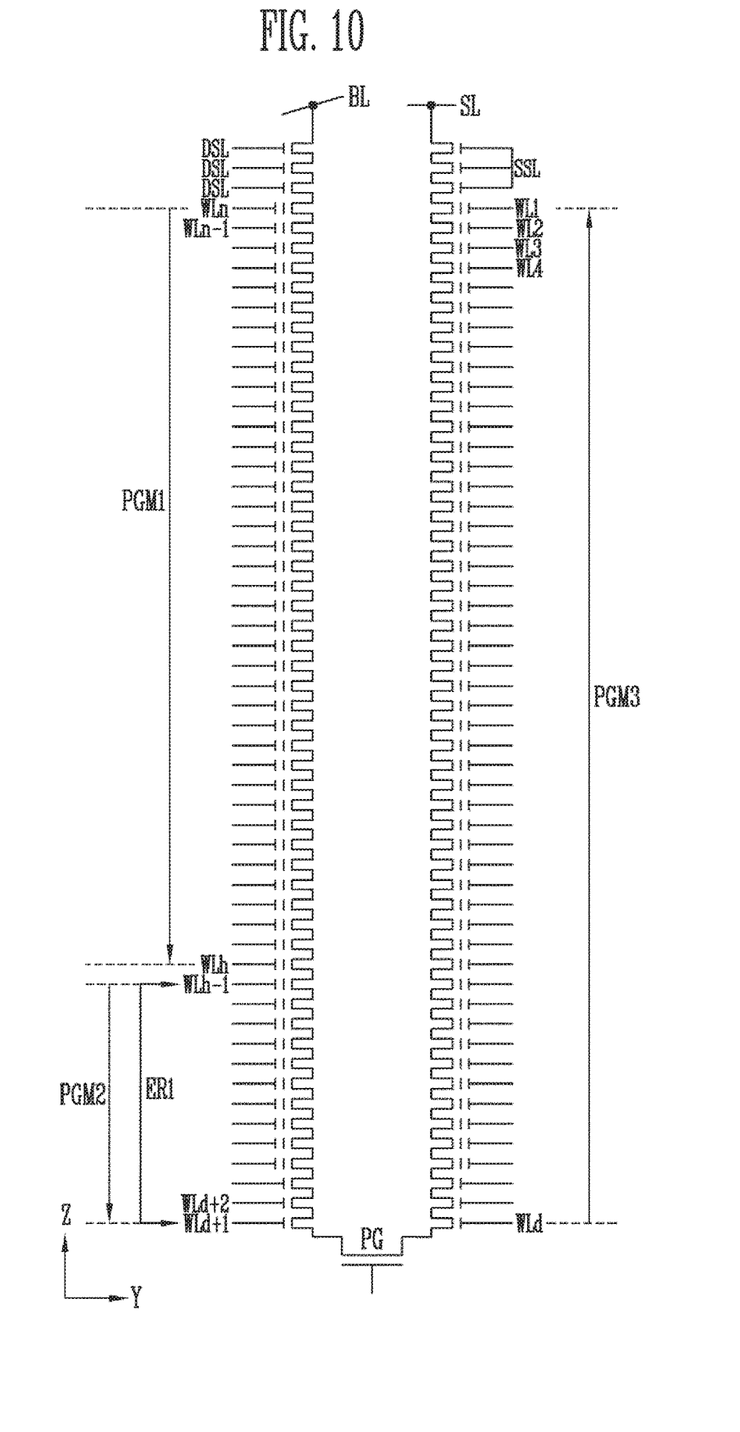
FIG. 10 is a diagram illustrating an example of a program operation according to an embodiment of the present disclosure.

FIG. 10 is a diagram illustrating an example of a program operation according to an embodiment of the present disclosure. Here, the program operation of the U-shaped string illustrated in FIG. 8 will be discussed.

Referring to FIG. 10, the program operation according to an embodiment may be sequentially performed in an order from a page located at the uppermost end of the source string (ST_S of FIG. 8) or the drain string (ST_D of FIG. 8) to a page located at a lower position. For example, in the U-shaped string, it may be assumed that the word line located at the uppermost end among the word lines coupled to the source string (ST_S of FIG. 8) is a first word line WL1, and it may be assumed that the word line at the lowermost end among the word lines coupled to the source string (ST_S of FIG. 8) is a $d^{th}$ word line WLd. Also, it may be assumed that the word line located at the uppermost end among the word lines coupled to the drain string (ST_D of FIG. 8) is an $n^{th}$ word line WLn, and it may be assumed that the word line at the lowermost end among the word lines coupled to the drain string (ST_D of FIG. 8) is a $(d+1)^{th}$ word line WLd+1 (d and n are positive integers, and 1<d<n).

If it is assumed that the program operation is started from an $n^{th}$ page coupled to the $n^{th}$ word line WLn located at the uppermost end of the drain string ST_D, after the program operation of the $n^{th}$ page is completed, the program operation may be performed on an $(n-1)^{th}$ page adjacent to a lower end of the $n^{th}$ page and coupled to an $(n-1)^{th}$ word line.

If it is assumed that a first program operation performed from the $n^{th}$ page is a first partial program operation PGM1, the first partial program operation PGM1 may be sequentially performed in an order from first to $h^{th}$ pages respectively coupled $n^{th}$ to $h^{th}$ word lines WLn to WLh (h is a positive integer, and d<h<n). Here, the $h^{th}$ page may be an arbitrarily set page.

If the first partial program operation PGM1 is completed, a first partial erase operation ER1 may be performed on pages included in the drain string ST_D, on which the first partial program operation PGM1 has been performed, among the pages on which the program operation has not been performed. For example, the first partial erase operation ER1 may be performed on $(h-1)^{th}$ to $(d+1)^{th}$ pages respectively coupled to $(h-1)^{th}$ to $(d+1)^{th}$ word lines WLh-1 to WLd+1. In an embodiment, the program operation of the source string ST_S may be performed in an order from the lower end to the upper end, and thus a partial erase operation for pages in the source string ST_S may be omitted, thereby reducing an operation time.

If the first partial erase operation ER1 is completed, a second partial program operation PGM2 may be sequentially performed on the $(h-1)^{th}$ to $(d+1)^{th}$ pages on which the first partial erase operation ER1 has been performed.

If the second partial program operation PGM2 is completed, a third partial program operation may be sequentially performed on $d^{th}$ to first pages respectively coupled to $d^{th}$ to first word lines WLd to WL1 of the source string ST_S. That is, if the second partial program operation PGM2 is completed, the third partial program operation PGM3 may be continuously performed.

In an embodiment, addresses of a plurality of pages among pages of one of the drain and source strings ST_D and ST_S, on which the program operation is first performed, may be previously set and stored, and partial program operations and partial erase operations can be performed using the stored addresses as set addresses.

Figure 11:
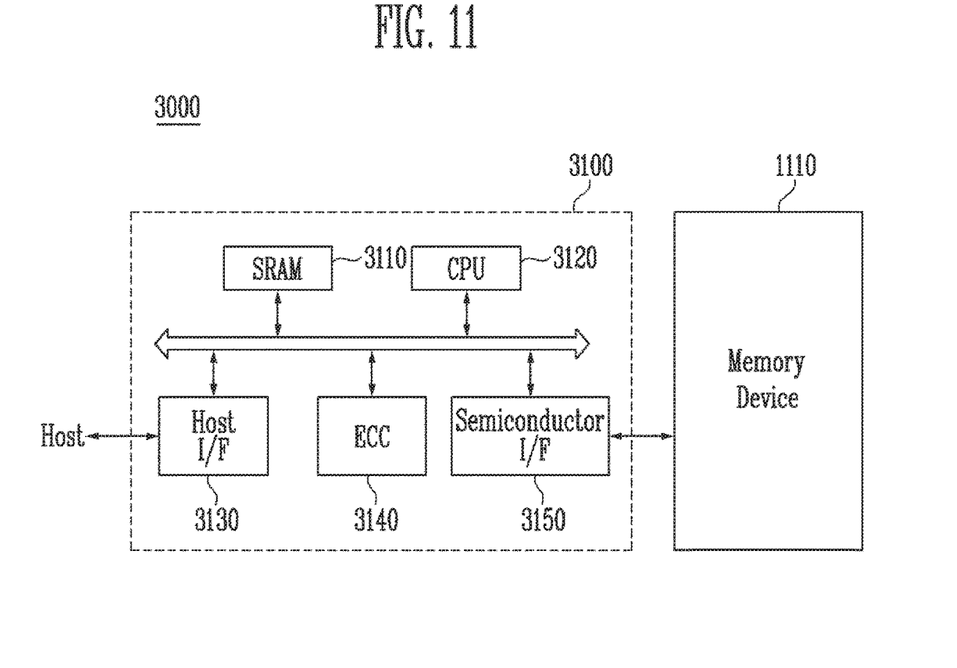
FIG. 11 is a diagram illustrating an example of a memory system including a memory device according to an embodiment of the present disclosure.

FIG. 11 is a diagram illustrating an example of a memory system including a memory device according to an embodiment of the present disclosure. Here, a memory device 1110 may be configured substantially identical to that of FIG. 2, and therefore detailed description of the memory device 1110 will be omitted.

Referring to FIG. 11, the memory system 3000 may include a controller 3100 and the memory device 1110. The controller 3100 may control the memory device 1110. An SRAM 3110 may be used as a working memory of a CPU 3120. A host interface (host I/F) 3130 may be provided with a data exchange protocol of a host coupled to the memory system 3000. An error correction circuit (ECC) 3140 provided in the controller 3100 may detect and correct errors included in data read out from the memory device 1110. A semiconductor interface (semiconductor I/F) 3150 may interface with the memory device 1110. The CPU 3120 may perform a control operation for data exchange of the controller 3100. Although not illustrated in FIG. 11, the memory system 3000 may further include a ROM (not illustrated) for storing code data for interfacing with the host.

The memory system 3000 may be applied to a computer, a ultra mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital video recorder, a digital video player, a device capable of transmitting/receiving information in a wireless environment, and one of various electronic devices that constitute a home network.

Figure 12:
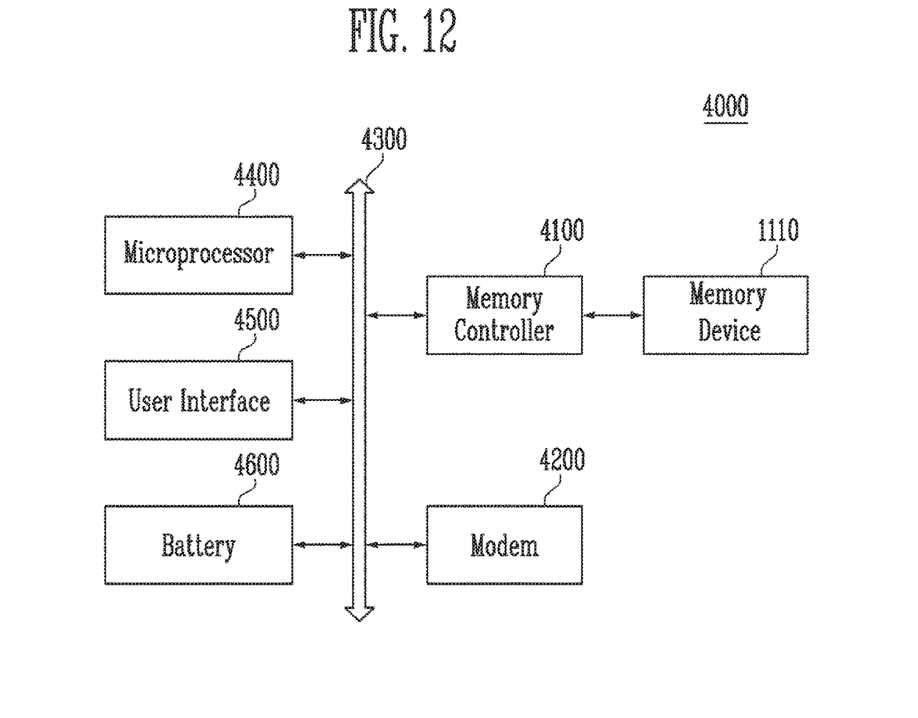
FIG. 12 is a diagram illustrating an example of a computing system including a memory device according to an embodiment of the present disclosure.

FIG. 12 is a diagram illustrating an example of a computing system including a memory device according to an embodiment of the present disclosure. Here, a memory device 1110 may be configured substantially identical to that of FIG. 2, and therefore, detailed description of the memory device 1110 will be omitted.

Referring to FIG. 12, the computing system 4000 includes the memory device 1110, a controller 4100, a modem 4200, a microprocessor 4400, and a user interface 4500, which are electrically coupled to a bus 4300. When the computing system 4000 is a mobile device, a battery 4600 for supplying operating voltages of the computing system 4000 may be additionally provided in the computing system 4000. Although not illustrated, the computing system 4000 may further include an application chip set, a camera image processor (CIS), a mobile DRAM, and the like.

The controller 4100 and the memory device 1110 may constitute an SSD.

The system according to an embodiment of the present disclosure may be packaged in various forms. For example, the system according to an embodiment of the present disclosure may be packaged in any one of package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

According to an embodiment of the present disclosure, it is possible to improve the reliability of a program operation of the memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of operating a memory device including a string coupled between a source line and a bit line, the method comprising:

programming an Nth memory cell from the bit line in the string;

programming an Mth memory cell from the source line after the Nth memory cell from the bit line is programmed in the string;

erasing memory cells coupled between the Nth memory cell from the bit line and the Mth memory cell from the source line after the Mth memory cell from the source line is programmed; and programming the erased memory cells, wherein N and M are positive integers.

2. The method of claim 1, wherein the Nth memory cell from the bit line is programmed by applying a program voltage to a word line coupled to the Nth memory cell from the bit line, and applying a pass voltage to word lines coupled to remaining memory cells, and the Mth memory cell from the source line is programmed by applying a program voltage to a word line coupled to the Mth memory cell from the source line, and applying the pass voltage to word lines coupled to remaining memory cells.

3. The method of claim 1, wherein when the memory cells coupled between the Nth memory cell from the bit line and the Mth memory cell from the source line are erased, the Nth memory cell from the bit line and the Mth memory cell from the source line are not erased.

4. A method of operating a memory device including a plurality of memory cells coupled between a source line and a bit line, the method comprising:

performing a first program operation on memory cells relatively closer to the bit lines and memory cells relatively closer to the source line, respectively, among the plurality of memory cells;

performing a first erase operation on memory cells, among the plurality of memory cells, except the memory cells on which the first program operation is performed;

performing a second program operation on memory cells among the memory cells on which the first erase operation is performed;

performing a second erase operation on memory cells, among the plurality of memory cells, except the memory cells on which the first program operation or the second program operation are performed; and performing a third program operation on memory cells among the memory cells on which the second erase operation is performed.

5. The method of claim 4, wherein when the third program operation is performed a third erase operation is performed on memory cells, among the plurality of memory cells, except the memory cells on which the first program operation, the second program operation, or the third program operation are performed.

6. A method of operating a memory device including a plurality of pages coupled between a source line and a bit line, the method comprising:

programming an Nth page relatively close to the source line and an Nth page relatively close to the bit line, respectively, among the plurality of pages;

erasing pages between the Nth pages; and programming the pages erased between the Nth pages, wherein N is a positive integer.

7. The method of claim 6, wherein each of the pages includes a plurality of memory cells coupled to a same word line.

* * * * *